United States Patent
Gatti

(10) Patent No.: US 6,181,557 B1
(45) Date of Patent: Jan. 30, 2001

(54) ELECTRONIC COMPONENT, METHOD OF COOLING, AND DAMPER THEREFOR

(75) Inventor: John E. Gatti, Scottsdale, AZ (US)

(73) Assignee: Motorola, Inc., Schaumburg, IL (US)

( * ) Notice: Under 35 U.S.C. 154(b), the term of this patent shall be extended for 0 days.

(21) Appl. No.: 09/430,727

(22) Filed: Oct. 29, 1999

(51) Int. Cl.[7] .................................................. H05K 7/20
(52) U.S. Cl. .......................... 361/695; 361/687; 361/694; 361/717; 361/719; 257/713; 257/714; 174/16.2; 454/184; 165/122; 415/177
(58) Field of Search .................................... 361/687, 690, 361/717–719, 725, 727, 692–699; 454/184, 353, 346, 347, 359; 157/849; 415/177, 178, 213.1, 214.1; 165/122–126, 104.33; 137/512.1, 601, 607; 62/259.2; 236/49.3; 257/706–727; 174/15.1, 16.2

(56) References Cited

U.S. PATENT DOCUMENTS

| | | | |
|---|---|---|---|
| 4,358,934 | * 11/1982 | VanKirk ................................. | 62/180 |
| 4,648,007 | * 3/1987 | Garner ................................. | 361/384 |
| 4,887,522 | * 12/1989 | Kuno et al. ........................... | 98/40.2 |
| 4,887,641 | * 12/1989 | Alley ..................................... | 137/601 |
| 5,227,658 | * 7/1993 | Goetti ................................... | 454/259 |
| 5,414,591 | * 5/1995 | Kimura et al. ........................ | 361/695 |
| 5,793,610 | * 8/1998 | Schmitt et al. ....................... | 361/695 |
| 5,890,959 | * 4/1999 | Pettit et al. ........................... | 454/184 |
| 6,000,623 | * 12/1999 | Blatti et al. ........................... | 236/49.3 |
| 6,005,770 | * 12/1999 | Schmitt ................................. | 361/695 |
| 6,011,689 | * 1/2000 | Wrycraft ............................... | 361/695 |
| 6,031,717 | * 2/2000 | Baddour et al. ..................... | 361/687 |

FOREIGN PATENT DOCUMENTS

| | | | |
|---|---|---|---|
| 402128499 | * 5/1990 | (JP) ................................. | H05K/7/20 |
| 403034395 | * 2/1991 | (JP) ................................. | H05K/7/20 |

\* cited by examiner

Primary Examiner—Leo Picard
Assistant Examiner—Michael Datskovsky
(74) Attorney, Agent, or Firm—S. Kevin Pickens

(57) ABSTRACT

An electronic component (100) includes an electronic equipment enclosure (110), a plurality of electronic devices (121) inside the enclosure, air movers (130) capable of cooling the electronic devices, and a separate barometric vane dampers (201, 202) adjacent to each of the air movers. The electronic component includes N+1 air movers where N is a minimum number of air movers required to cool the enclosure. Additionally, each of the barometric vanes has at least one stop to limit its movement. Furthermore, the barometric vanes are contoured to direct air flow within the electronic equipment enclosure and are closeable by gravity when the air movers are stationary.

6 Claims, 5 Drawing Sheets

ELECTRONIC COMPONENT, METHOD OF COOLING, AND DAMPER THEREFOR

FIELD OF THE INVENTION

This invention relates, in general, to electronic components and, more particularly, to the cooling of electronic components.

BACKGROUND OF THE INVENTION

Electronic components such as, for example, computers have electronic devices that generate heat when in operation. The electronic devices are typically contained within an equipment enclosure, and the heat from the devices should be dissipated from the enclosure to prevent premature failures of the devices resulting from excessive heat trapped within the equipment enclosure. Accordingly, the electronic components typically use either a single fan or multiple fans to cool the electronic devices. The single or multiple fans bring air from outside of the equipment enclosure into the enclosure to cool the air within the enclosure.

One problem with the cooling systems that use a single fan occurs when the fan burns out or ceases to function. Under this condition, the heat within the electronic enclosure is not dissipated and the electronic devices within the enclosure may fail from the excessive heat. One problem with the cooling systems that use multiple fans occurs when one or several of the fans burn out or cease to function. Under this condition, although some of the fans are still operational, the electronic enclosure is not properly cooled, and the electronic devices may still fail from the excessive heat. Proper cooling is not achieved due to the backflow of air out of the burned-out fan or fans. This backflow of air reduces the proper circulation of air through the electronic enclosure.

Accordingly, a need exists for an electronic component and method of cooling that solves or at least alleviates the problems of fan burn-out and air backflow out of improperly functioning fans.

BRIEF DESCRIPTION OF THE DRAWINGS

The present invention will be better understood from a reading of the following detailed description, taken in conjunction with the accompanying drawing figures in which.

Figure 1:
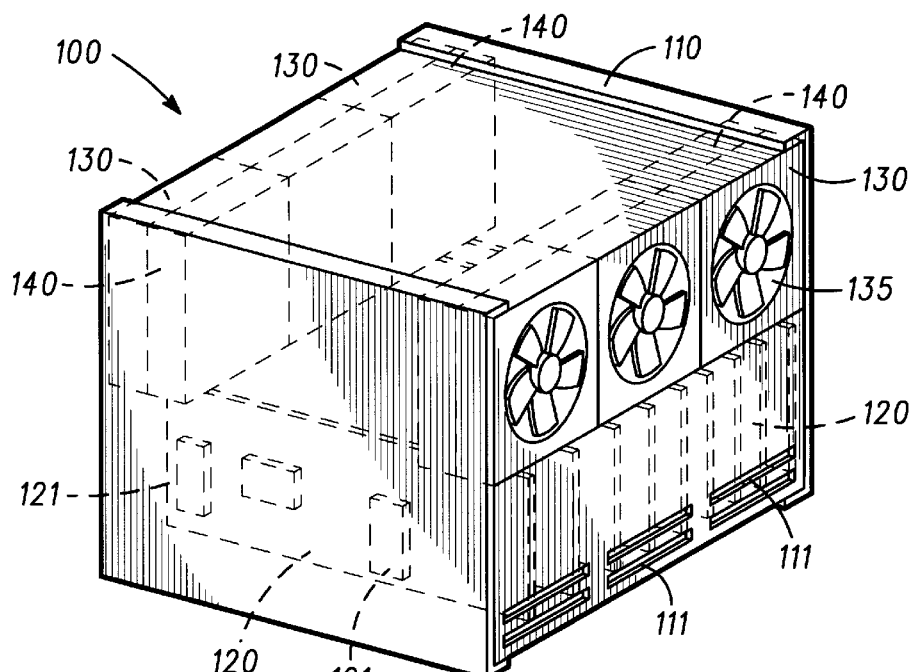
FIG. 1 illustrates a schematic isometric view of an electronic component including a barometric damper in accordance with an embodiment of the present invention.

For simplicity and clarity of illustration, the drawing figures illustrate the general manner of construction, and elements in the drawing figures are not necessarily drawn to scale. Additionally, the same reference numerals in different figures denote the same elements, and descriptions and details of well-known features and techniques are omitted to avoid unnecessarily obscuring the present invention. Furthermore, the terms left, right, front, back, top, bottom, over, under, and the like in the description and in the claims, if any, are used for descriptive purposes. However, it is understood that the embodiment of the invention described herein is capable of operation in other orientations than described or illustrated herein. It is further understood that the terms so used are for the purposes of describing relative positions and are interchangeable under appropriate circumstances.

DETAILED DESCRIPTION OF THE DRAWINGS

FIG. 1 illustrates a schematic isometric view of an electronic component 100 including a barometric shutter or damper 140 in accordance with an embodiment of the present invention. Component 100 includes, among other features, an electronic equipment enclosure 110. A plurality of electronic boards 120 that contain a plurality of electronic devices 121 are located inside or within enclosure 110. Boards 120 and devices 121 can be coupled together within enclosure 110 to form an electronic system. Component 100 can also be coupled with other electronic components and devices to expand the electronic system. Suitable examples of component 100 include communications equipment such as radios and Radio Frequency (RF) equipment, medical equipment, traffic control equipment, computers, and the like. By way of example, component 100 is a computer, and devices 121 can include, among other devices, a central processing unit and a memory unit.

In accordance with one embodiment, component 100 includes a plurality of air movers 130 that are adjacent to a perimeter of enclosure 110. As an example, air movers 130 can be axial fans, tube-axial fans, centrifugal blowers, backward curved impellers, crossflow blowers, or the like. The number of air movers to be included in component 100 preferably equals N+1, where N is the minimum number of fans required to cool the air within enclosure 110. The use of N+1 air movers includes a redundant or extra fan so that component 100 may continue to operate normally even if one of the air movers fails, slows down, or otherwise ceases to operate properly. Such improper operation shall hereinafter be referred to as a failure or a failed fan.

Figure 2:
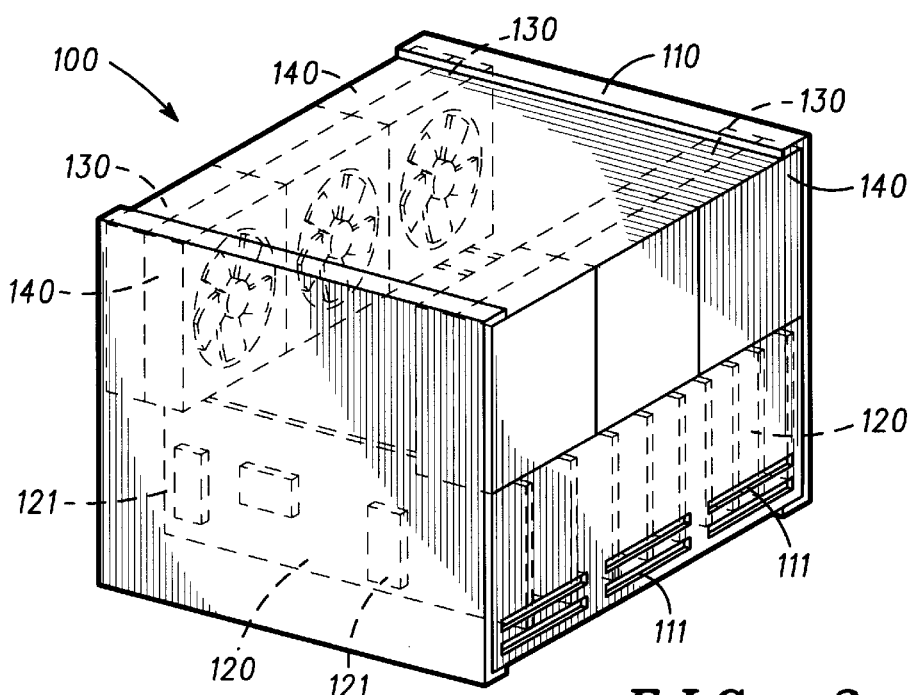
FIG. 2 illustrates a schematic isometric view of an electronic component including a barometric damper in accordance with an embodiment of the present invention.

Component 100 further includes a plurality of barometric shutters or dampers 140 located adjacent to air movers 130. In the embodiment illustrated in FIG. 1, dampers 140 are positioned such that air movers 130 are between a corresponding damper 140 and a wall of enclosure 110, and each of air movers 130 is associated with its own separate damper 140. Each of dampers 140 opens to allow air to flow into enclosure 110 from its associated air mover 130. In the event of a failure of one or more air movers 130, each damper 140 associated with the failed air mover 130 preferably automatically shuts or closes to prevent air from flowing out of enclosure 110 through its associated air mover. In an alternative embodiment, illustrated in FIG. 2, dampers 140 are positioned to be between air movers 130 and a wall of enclosure 110. The physical and operational details of dampers 140 are explained hereinafter.

Enclosure 110 includes a plurality of holes 135. Some of the holes are located adjacent to air movers 130 to permit air movers 130 to blow air into enclosure 110, and other holes in enclosure 110 are represented by slots 111 at the bottom of component 100. The air blown or drawn into enclosure 110 by air movers 130 escapes from or leaves enclosure 110 through slots 111. In an alternative embodiment air movers 130 extract air out of enclosure 110, in which case slots 111 serve as air intake ports. Although a plurality of holes 135 are shown, it should be understood this is not a limitation of the present invention. For example, a single hole or port 135 may be used in which one or air movers are installed.

In operation, devices 121 generate heat and increase the temperature of the air within enclosure 110. Air movers 130 cool the air within enclosure 110 by blowing air from outside of enclosure 110 into enclosure 110. The air is moved or circulated within enclosure 110 and exits out of enclosure 110 from slots 111. The circulation of air within enclosure 110 cools devices 121.

As described in more detail hereinafter, dampers 140 include a plurality of barometric blades or vanes to direct the flow of air inside or within enclosure 110. In the preferred embodiment, air pressure from air movers 130 opens dampers 140 to allow air into enclosure 110 when air movers 130 are in operation, but dampers 140 automatically close if air movers 130 fail. The barometric or automatic closing of dampers 140 results from gravity overcoming inadequate air pressure from air movers 130. Therefore, if one of air movers 130 fails, the damper associated with the failed air mover automatically shuts, but the dampers not associated with the failed air mover remain open. The damper associated with the failed air mover shuts to prevent the backflow of air out of the failed air mover and to maintain sufficient air pressure and the proper flow of air within enclosure 110 such that the air properly exits enclosure 110 through slots 111. By maintaining the proper air flow within enclosure 110, devices 121 will not overheat.

Figure 3:
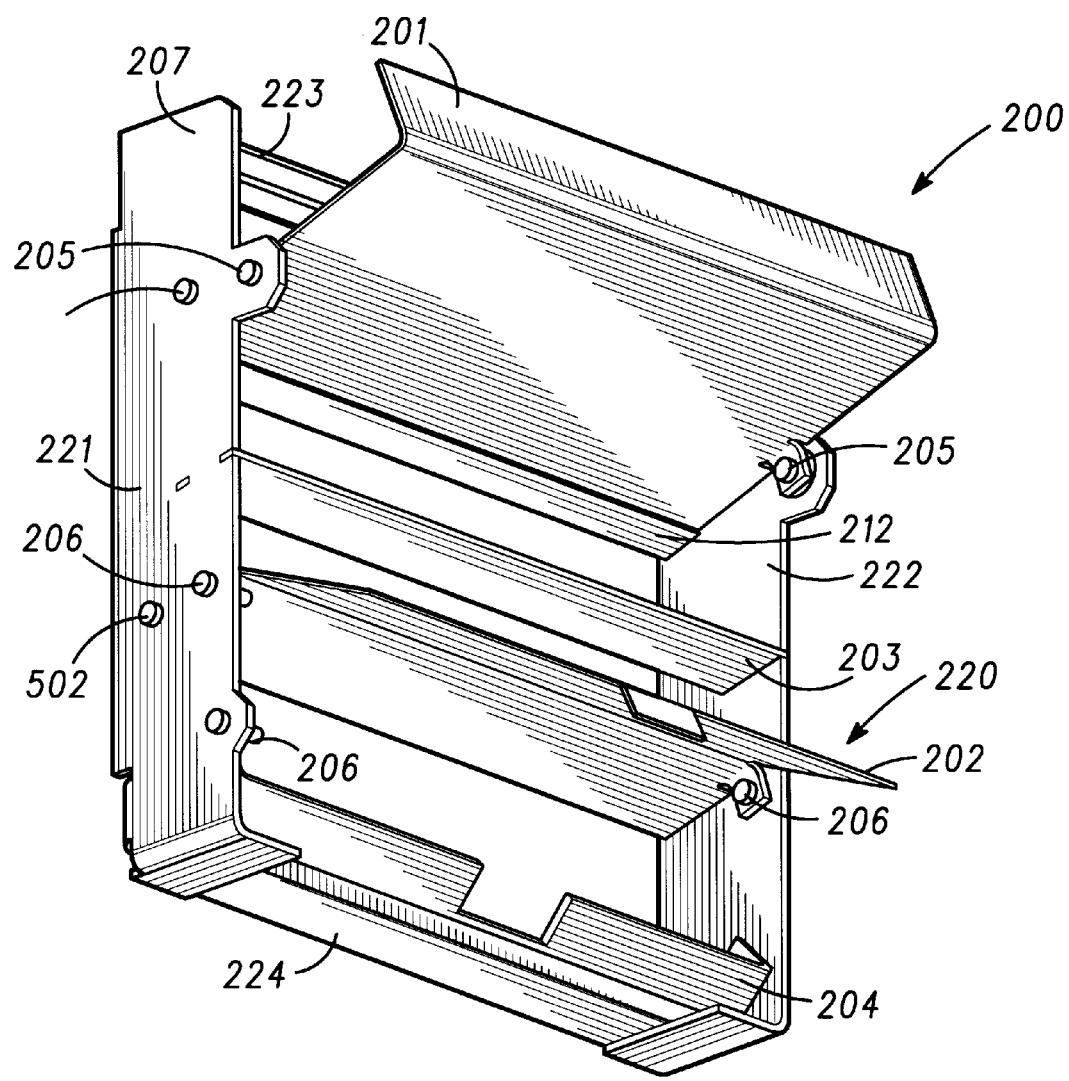
FIG. 3 illustrates a front isometric view of a barometric damper in accordance with an embodiment of the present invention.
Figure 4:
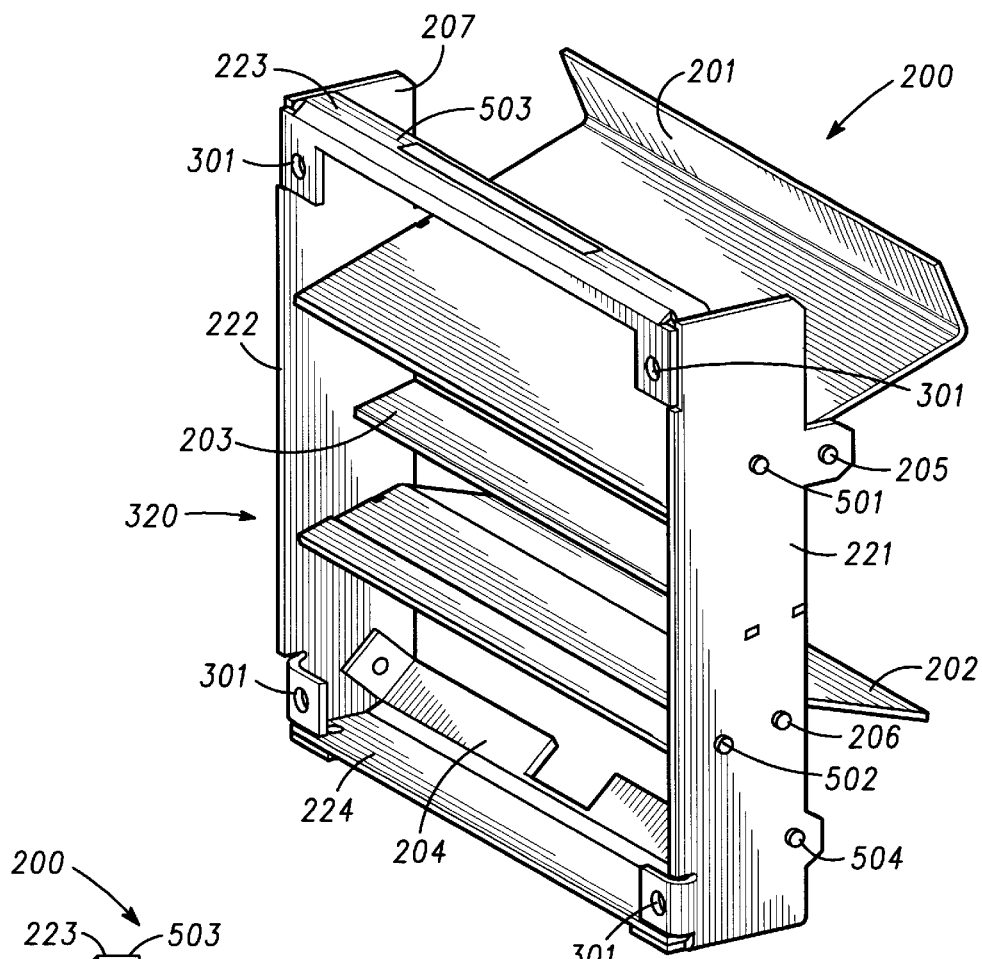
FIG. 4 illustrates a back isometric view of the barometric damper shown in FIG. 3.
Figure 5:
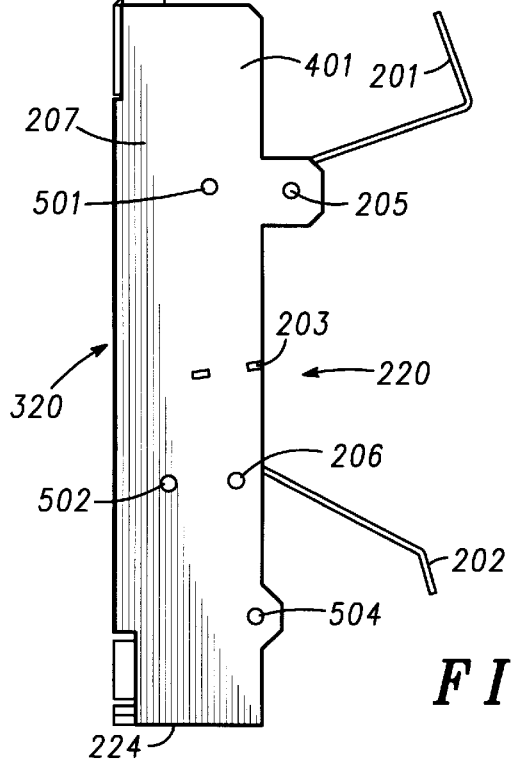
FIG. 5 illustrates a left side view of the barometric damper shown in FIGS. 3 and 4.

Turning to FIGS. 3, 4, and 5, a barometric damper 200 is illustrated in an open position from a front isometric view in FIG. 3, from a back isometric view in FIG. 4, and from a left side view in FIG. 5. Damper 200 is an embodiment of one of dampers 140 in FIG. 1. Damper 200 has a front side 220 (FIGS. 3 and 5), a back side 320 (FIGS. 4 and 5), a left side 221 (FIGS. 3, 4, and 5), a right side 222 (FIGS. 3 and 4), a top side 223, and a bottom side 224. If each of dampers 140 in FIG. 1 is similar to damper 200, the front side 220 of damper 200 faces into the central portion of enclosure 110 (FIG. 1); the back side 320 of damper 200 faces towards the respective ones of air movers 130 (FIG. 1); the top side 223 faces towards the top of enclosure 110 (FIG. 1); and the bottom side 224 faces towards the central portion of enclosure 110 (FIG. 1) and devices 121 (FIG. 1).

Damper 200 has a frame 207 with a plurality of mounting holes 301 (FIG. 4) to facilitate the coupling of damper 200 to an air mover, but it is not necessary for damper 200 to be directly attached to an air mover. In the preferred embodiment, damper 200, including frame 207, is comprised of an inexpensive rigid material that is capable of directing air flow and that is compatible with the high temperatures within an electronic equipment enclosure. As an example, damper 200 can be comprised of aluminum.

Damper 200 further includes, among other features, a plurality of vanes 201 and 202 and a plurality of louvers 203 and 204. Vanes 201 and 202 and louvers 203 and 204 are collectively referred to as blades and are coupled to frame 207. Vanes 201 and 202 are barometrically operated vanes and are also referred to as barometric vanes. Vanes 201 and 202 are movable relative the frame 207. Louvers 203 and 204 are fixed or stationary louvers. In the preferred embodiment, fixed louver 203 is located between barometric vanes 201 and 202, and barometric vane 202 is located between fixed louvers 203 and 204.

When an associated air mover is off or has failed, damper 200 will be in a closed position where vanes 201 and 202 are closed. In this closed position, the ends of vanes 201 and 202 that are illustrated to be protruding from front side 220 of damper 200 in FIG. 3 will be located closer to the top side 223 and the bottom side 224, respectively, of damper 200. When the associated air mover is stationary or has slowed down, gravity automatically closes vanes 201 and 202. Depending on the configuration of vanes 201 and 202, a ballast may be needed to permit gravity to automatically close vanes 201 and 202. In the preferred embodiment, one end of vane 201 has a ballast 212 (FIG. 1). In an alternative embodiment, vanes 201 and 202 can be automatically closed by a backflow of air from within an electronic equipment enclosure after the associated air mover has failed, as described hereinbefore.

Vanes 201 and 202 are movable or rotatable about hinges or pivot regions 205 and 206, respectively. In one embodiment, vanes 201 and 202 rotate in opposite directions to their respective open positions when the associated air mover is on or is in operation. For example, when damper 200 is viewed from the left side in FIG. 5, vane 201 rotates clockwise to open, and vane 202 rotates counter-clockwise to open. In another embodiment, vanes 201 and 202 rotate in the same direction to their respective open positions when the associated air mover is on or is in operation. It should be noted that vanes 201 and 202 can be configured to rotate independently of each other or they can be connected to move dependently using, for example, a control rod.

Vanes 201 and 202 are also shaped or contoured to direct the flow of air within an electronic equipment enclosure, such as enclosure 110 in FIG. 1. Preferably, vanes 201 and 202 are contoured differently to direct air in different directions. Additionally, louvers 203 and 204 can also be shaped or contoured to further direct the air flow from an associated air mover into an equipment enclosure. For example, if each of dampers 140 in FIG. 1 is similar to damper 200 in FIG. 3 and is oriented within enclosure 110 (FIG. 1) as described hereinbefore, vane 201 directs a portion of the air flow to the top of enclosure 110 (FIG. 1) where the heated air within enclosure 110 (FIG. 1) will rise, and vane 202 directs a different portion of the air flow towards the bottom of enclosure 110 (FIG. 1) where the heat is generated by devices 121 (FIG. 1). It should be understood that the shape of vanes 201 and 202 is not a limitation of the present invention. For example, vanes 201 and 202 can have the same shape for directing the air flow in a desired direction. Further, it should be noted that directing the air flow may not be necessary.

Figure 6:
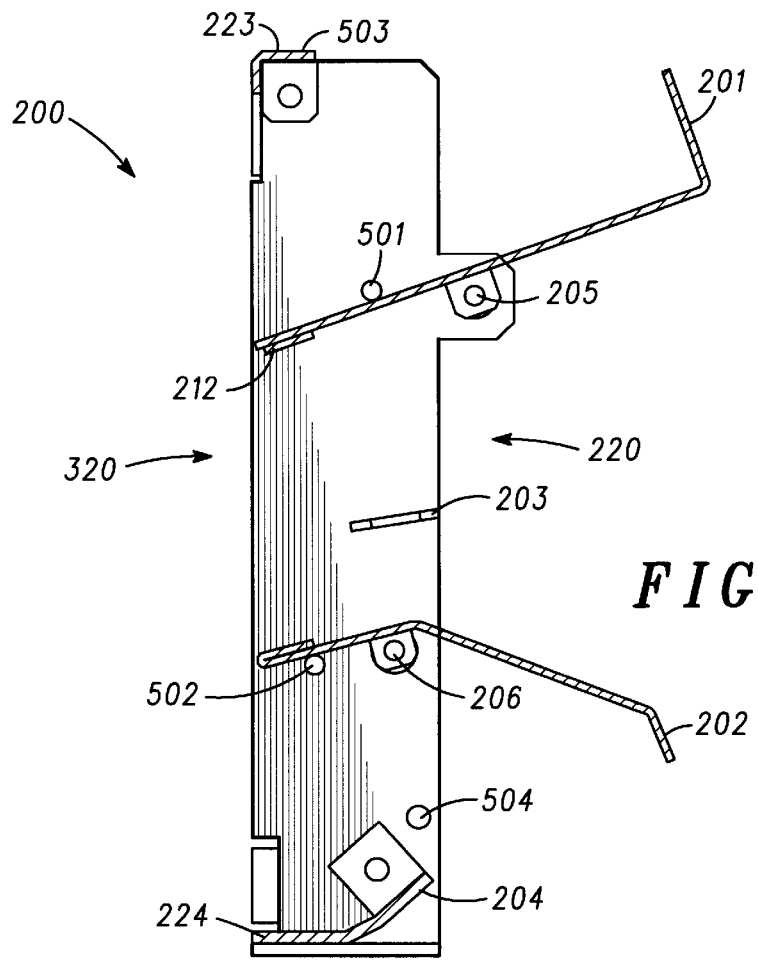
FIG. 6 illustrates a left cross-sectional view of the barometric damper shown in FIGS. 1, 3, and 4 in an open configuration.

FIG. 6 illustrates a cross-sectional view of barometric damper 200 from the left side of damper 200. In FIG. 6, damper 200 is illustrated to include a plurality of motion stops 501 and 503, which are adjacent to vane 201, and a plurality of motion stops 502 and 504, which are adjacent to vane 202. Stops 501 through 504 are capable of limiting the movement of vanes 201 and 202. In particular, stops 501 and 502 limit the movement of vanes 201 and 202, respectively, when the associated air mover is on or is in operation, and stops 503 and 504 limit the movement of louvers 203 and 204, respectively, when the associated air mover has failed.

Figure 8:
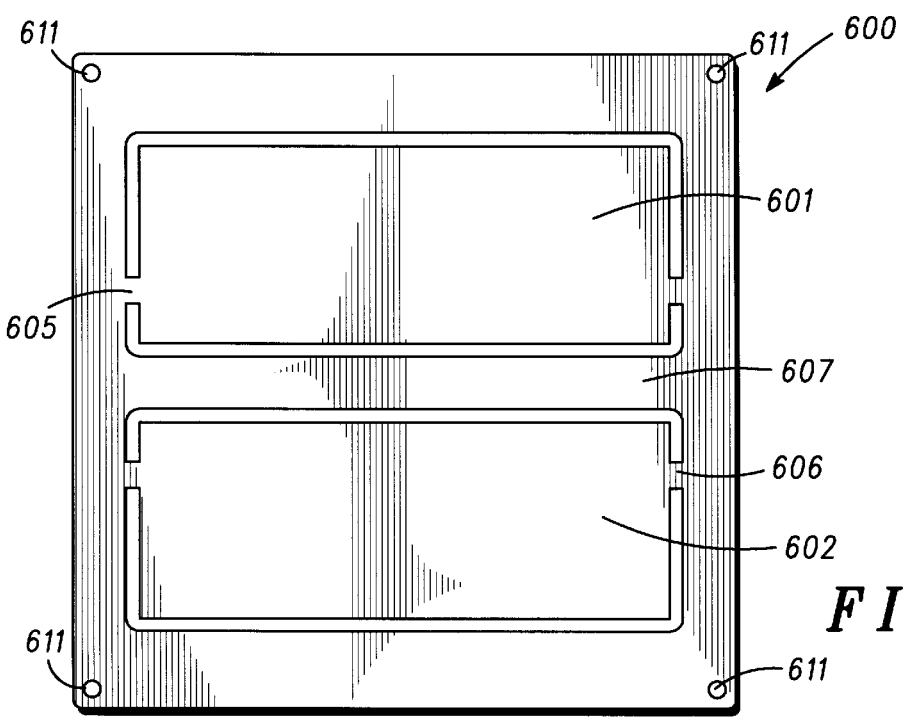
FIG. 8 illustrates a front view the barometric damper in accordance with another embodiment of the present invention.
Figure 7:
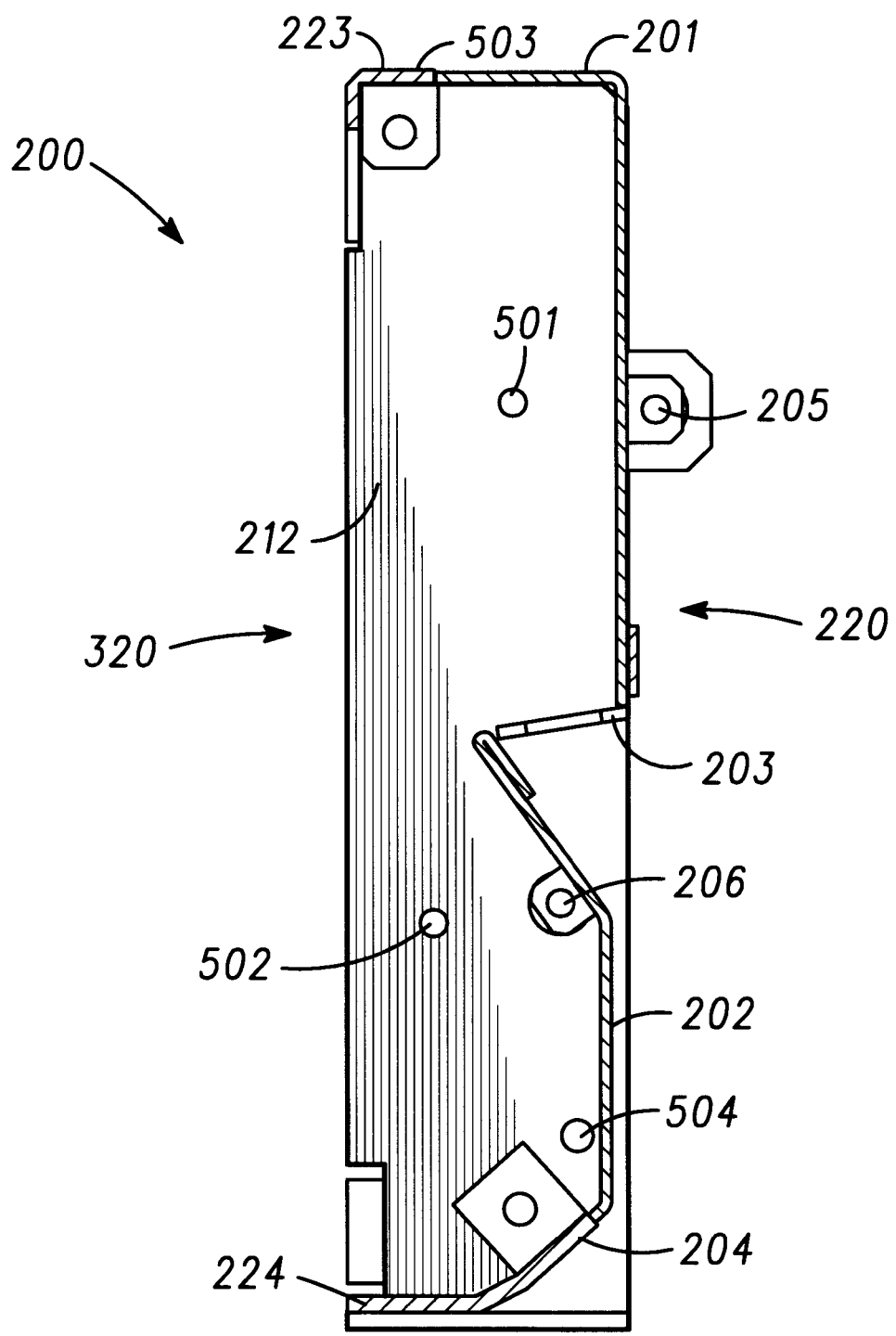
FIG. 7 illustrates a left cross-sectional view of the barometric damper shown in FIGS. 1, 3, and 4 in a closed configuration.

FIG. 8 illustrates a front view of a barometric damper 600, which is similar in function and operation to barometric damper 200 in FIG. 3. like damper 200, damper 600 includes vanes 601 and 602, hinges or pivot regions 605 and 606, a frame 607 around vanes 601 and 602, and mounting holes 611 in frame 607. However, unlike damper 200, damper 600 is a unitary structure. Motion stops for vanes 601 and 602 can be provided by the associated air mover, the electronic equipment enclosure, or other items within the electronic equipment enclosure.

Furthermore, damper 600 is comprised of a thin, flexible material such as, for example, a plastic that is deformable by air blown by an associated air mover. However, the material should be compatible with the high temperatures within an electronic equipment enclosure. As an example, a flexible synthetic film commercially available under the name Mylar™ from D.I. du Pont de Neumours and Company of Wilmington, Del. can be used for damper 600.

Therefore, an improved electronic component and method of cooling is provided to overcome the disadvantages of the prior art. The component and cooling method eliminates or at least alleviates the problems of fan burn-out and air backflow associated with nonfunctioning fans. The component and cooling method also provide a less expensive, more quiet, and smaller solution than using double the minimum number of fans required to cool an electronic equipment enclosure.

The disclosure of the present invention described herein is enabled and can be realized and practiced without undue experimentation. Although the best mode of carrying out the present invention contemplated by the inventors is disclosed hereinabove, practice of the present invention is not limited thereto. Furthermore, while the present invention has been particularly shown and described with reference to specific embodiments, it will be understood by those skilled in the art that various changes may be made to the embodiments herein without departing from the spirit or scope of the present invention. For instance, the numerous details set forth herein such as, for example, the material compositions and the specific blade, or vane and louver, configurations are provided to facilitate the understanding of the present invention and are not provided to limit the scope of the present invention. Furthermore, one skilled in the art will understand that a single barometric damper can be used with a plurality of air movers if the single damper has individual or separate vanes for each of the air movers. Moreover, the barometric vanes may be replaced with vanes that are automatically closeable by magnetic or mechanical devices such as, for example, springs. Additionally, while the number of air movers to be included in the electronic component is described hereinbefore to be N+1, it is understood that the number of air movers can be increased to N+M where M is an integer greater than 1. Furthermore, the present invention is suitable for use in pressurized systems, i.e., systems in which a heat transfer media such as air is injected into the enclosure, as well as in evacuated systems, i.e., systems in which a heat transfer media is removed from the enclosure.

Accordingly, the disclosure of the present invention is not intended to be limiting. Instead, the disclosure of the present invention is intended to be illustrative of the scope of the present invention. It is intended that the scope of the present invention shall be limited only to the extent required by the appended claims and the rules and principles of applicable law. The appended claims are not to be interpreted as including means-plus-function limitations, unless such a limitation is expressly recited in a given claim using the phrase "means for".

What is claimed is:

1. An electronic component comprising:

an electronic equipment enclosure;

a plurality of electronic devices inside the electronic equipment enclosure;

a plurality of air movers adjacent to the electronic equipment enclosure to move air within the electronic equipment enclosure; and a plurality of dampers, wherein each of the plurality of dampers comprises a pair of movable vanes, wherein each vane of the pair of movable vanes is contoured and rotatable in opposite directions, thereby directing air in different directions, and wherein:

each of the plurality of air movers is located adjacent to a separate one of the plurality of dampers, and wherein each pair of movable vanes of the plurality of dampers is closeable by gravity.

2. The electronic component of claim 1 wherein:

a first one of each pair of movable vanes has a first contoured configuration; and a second one of each pair of movable vanes has a second contoured configuration different from the first contoured configuration.

3. The electronic component of claim 1 further comprising:

a plurality of stops located on each of the plurality of dampers for limiting movement of each pair of movable vanes.

4. The electronic component of claim 1 further comprising:

a fixed louver located between each pair movable vanes and located adjacent to the electronic equipment enclosure.

5. The electronic component of claim 1 wherein:

at least one movable vane in each pair of movable vanes includes a ballast.

6. An electronic component comprising:

an electronic equipment enclosure;

a plurality of electronic devices inside the electronic equipment enclosure;

a plurality of air movers adjacent to the electronic equipment enclosure to move air within the electronic equipment enclosure;

a plurality of dampers, wherein each of the plurality of dampers comprises a pair of flexible vanes, wherein each vane of the pair of flexible vanes is contoured and rotatable in opposite directions, thereby directing air in different directions and wherein:

each of the plurality of air movers is located adjacent to a separate one of the plurality of dampers, and wherein each of the flexible vanes of the plurality of dampers is comprised of a material deformable by air blown by one of the plurality of air movers.

* * * * *